United States Patent
Timofeev

(10) Patent No.: US 7,973,685 B1
(45) Date of Patent: Jul. 5, 2011

(54) METHOD AND APPARATUS FOR FILTERING DIGITAL SIGNALS

(75) Inventor: Sergey Timofeev, Santa Clara, CA (US)

(73) Assignee: Marvell International Ltd (BM)

(*) Notice: Subject to any disclaimer, the term of this patent is extended or adjusted under 35 U.S.C. 154(b) by 21 days.

(21) Appl. No.: 12/638,456

(22) Filed: Dec. 15, 2009

Related U.S. Application Data

(60) Provisional application No. 61/147,354, filed on Jan. 26, 2009.

(51) Int. Cl.
*H03M 1/06* (2006.01)

(52) U.S. Cl. ........ 341/118; 341/117; 341/119; 341/120; 341/155; 341/156; 375/376; 455/285

(58) Field of Classification Search .......... 341/117–120, 341/155, 156; 375/376; 455/285
See application file for complete search history.

(56) References Cited

U.S. PATENT DOCUMENTS

| | | | |
|---|---|---|---|
| 6,064,329 A | 5/2000 | Byrd et al. | |
| 6,204,784 B1 | 3/2001 | Hatfield | |
| 6,526,101 B1* | 2/2003 | Patel | 375/240.28 |
| 6,535,553 B1* | 3/2003 | Limberg et al. | 375/232 |
| 7,031,686 B2* | 4/2006 | Kim et al. | 455/285 |
| 7,391,842 B1* | 6/2008 | Melanson | 375/376 |
| 2007/0001891 A1 | 1/2007 | Mazhar | |
| 2007/0291883 A1 | 12/2007 | Welz et al. | |
| 2009/0154575 A1 | 6/2009 | Rofougaran | |

* cited by examiner

*Primary Examiner* — Jean B Jeanglaude

(57) ABSTRACT

Methods, and other embodiments associated with signal filtering are described. According to one embodiment, an apparatus includes an analog-to-digital converter that generates a first digital component and a second digital component from an analog signal. A filter filters the first digital component and the second digital component to substantially align the phase of the first digital component and the phase of the second digital component.

15 Claims, 5 Drawing Sheets

METHOD AND APPARATUS FOR FILTERING DIGITAL SIGNALS

CROSS REFERENCE TO RELATED APPLICATIONS

This application claims the benefit of U.S. provisional application Ser. No. 61/147,354 filed on Jan. 26, 2009, which is hereby wholly incorporated by reference.

BACKGROUND

In wireless communication schemes, signals are typically transmitted in the analog domain and processed in the digital domain. Accordingly, devices that communicate wirelessly typically include an analog-to-digital converter (ADC) to convert a received analog signal into a corresponding digital signal. An analog signal generally includes two components—a real component (I) and an imaginary (or conjugate) component (Q). In a device that includes only a single analog-to-digital converter, the analog-to-digital converter alternates (or ping-pongs) between sampling the real component and the conjugate component of the analog signal. Such alternate sampling of an analog signal introduces delays between corresponding real and conjugate components in the digital domain.

SUMMARY

In one embodiment, an apparatus comprises an analog-to-digital converter configured to: receive an analog signal. The analog signal includes a first analog component and a second analog component. The analog-to-digital converter alternately samples the first analog component and the second analog component to respectively generate a first digital component and a second digital component. The second digital component has a phase that is mismatched with respect to a phase of the first digital component due to the analog-to-digital converter alternately sampling the first analog component and the second analog component. A filter is configured to filter each of the first digital component and the second digital component, and substantially align the phase of the first digital component and the phase of the second digital component.

In another embodiment, a method includes receiving an analog signal, the analog signal having a first analog component and a second analog component. The first analog component and the second analog component are alternately sampled to respectively generate a first digital component and a second digital component, which due to the alternate sampling causes the second digital component to have a phase that is mismatched with respect to a phase of the first digital component. Each of the first digital component and the second digital component are filtered to substantially align the phase of the first digital component and the phase of the second digital component.

BRIEF DESCRIPTION OF THE DRAWINGS

The accompanying drawings, which are incorporated in and constitute a part of the specification, illustrate various example systems, methods, and other example embodiments of various aspects of the invention. The illustrated element boundaries (e.g., boxes, groups of boxes, or other shapes) in the figures represent one example of the boundaries. In some examples, a single element may be designed as multiple elements, and conversely, multiple elements may be designed as a single element. In some examples, an element shown as an internal component of another element may be implemented as an external component and vice versa. Furthermore, elements may not be drawn to scale.

DETAILED DESCRIPTION

Described herein are example apparatuses and other embodiments associated with signal conversion and filtering. The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment.

"Computer-readable medium", as used herein, refers to a storage medium that stores instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an application specific integrated circuit (ASIC), a programmable logic device, a compact disk (CD), other optical medium, a random access memory (RAM), a read only memory (ROM), a memory chip or card, a memory stick, and other media from which a computer, a processor or other electronic device can read.

"Logic", as used herein, includes but is not limited to hardware, firmware, software stored or in execution on a machine, and/or combinations of each to perform a function (s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into a single physical logic. Similarly, where a single logical logic is described, it may be possible to distribute that single logical logic between multiple physical logics.

Figure 1:
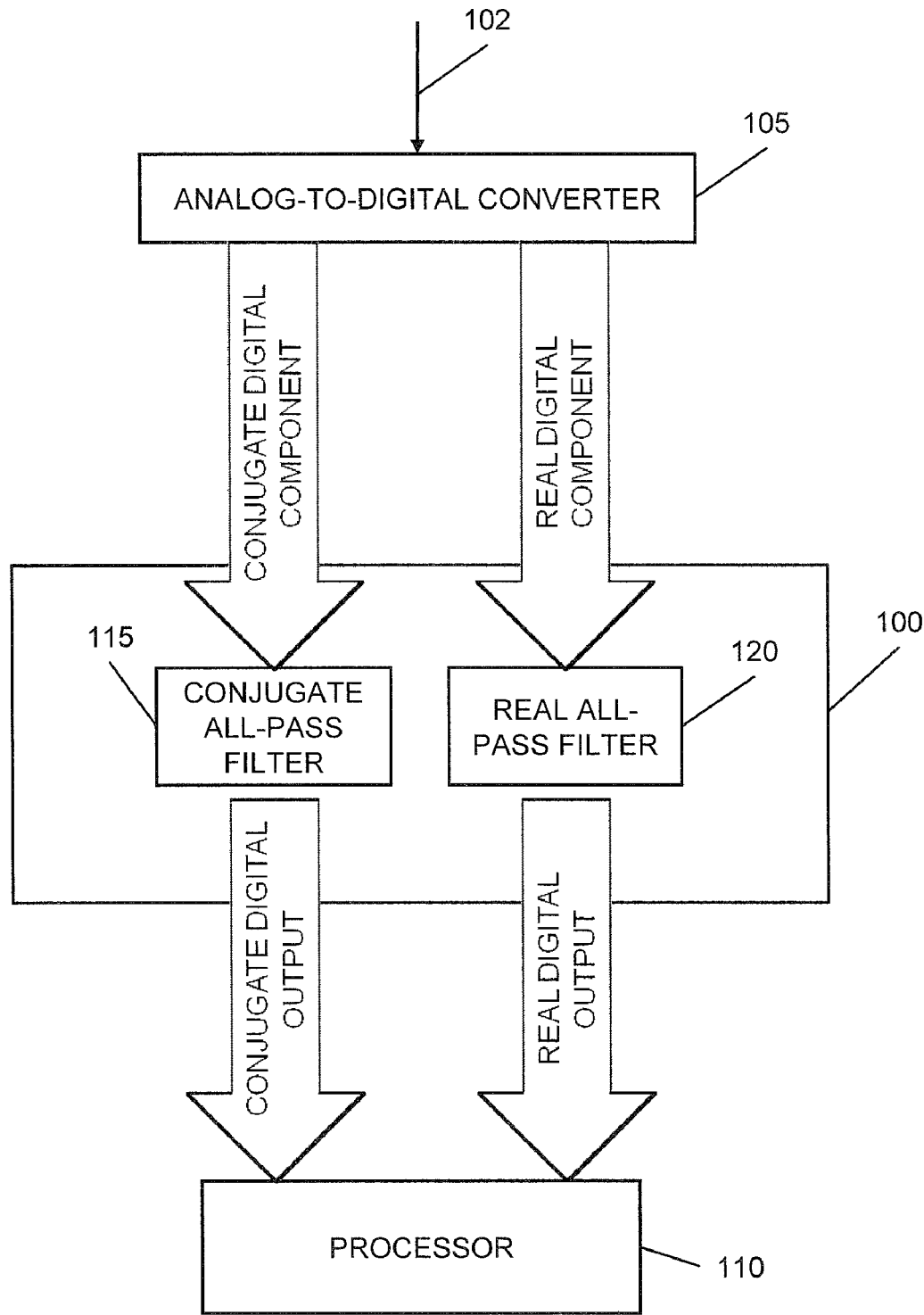
FIG. 1 illustrates one embodiment of an apparatus that filters a signal.

FIG. 1 illustrates components of a device operable to communicate wirelessly. In one embodiment, the device includes, inter alia, an analog-to-digital converter 105, an apparatus 100, and a processor 110. The analog-to-digital converter 105 receives a complex analog signal 102 that includes a real analog component (represented as I) and a conjugate analog component (represented as Q). The conjugate analog component is also commonly referred to as an imaginary component of the complex analog signal 102. The analog-to-digital converter 105 converts the complex analog digital signal 102 into a digital signal having a corresponding conjugate digital component and a real digital component. The apparatus 100 includes a conjugate all-pass filter 115 and a real all-pass filter 120 that respectively filters the conjugate digital component and the real digital component, and substantially aligns the conjugate digital component and the real digital component as discussed in greater detail below. The processor 110 processes the aligned digital components.

In some embodiments, the analog-to-digital converter 105 is configured to sample one signal component at a time. For example, a ping pong ADC saves chip area and power by having one ADC that alternates sampling the real component (I) and the conjugate component (Q). In one implementation, the analog-to-digital converter 105 operates at twice the rate of comparable dual analog-to-digital converters. Thus, in one example, the sampling interval is time/2. If the real analog component is sampled before the conjugate analog component, then the real digital component is delayed from the conjugate digital component. If the conjugate analog component is sampled before the real analog component, then the conjugate digital component is delayed from the real digital component. Due to this delay, phases of the real digital component and conjugate digital component do not match.

The apparatus 100 eliminates (or at least reduces) this delay. The conjugate all-pass filter 115 filters the conjugate digital component into a conjugate digital output signal. Likewise, the real all-pass filter 120 filters the real digital component into a real digital output signal. By using the all-pass filters 115 and 120, the magnitudes of the real digital component and the conjugate digital component are unchanged by filtering, and the phases of each signal are made to align more closely.

In one embodiment, filter coefficients are applied to the all-pass filters 115, 120 to adjust certain properties of their respective output signals. For example, coefficients may be selected to lower or minimize a phase difference between the output signals to better align the signals. Selection of coefficients is described in more detail with reference to FIG. 2. After the digital conjugate and real components are filtered and aligned, the aligned, components are passed to the processor 110.

Figure 2:
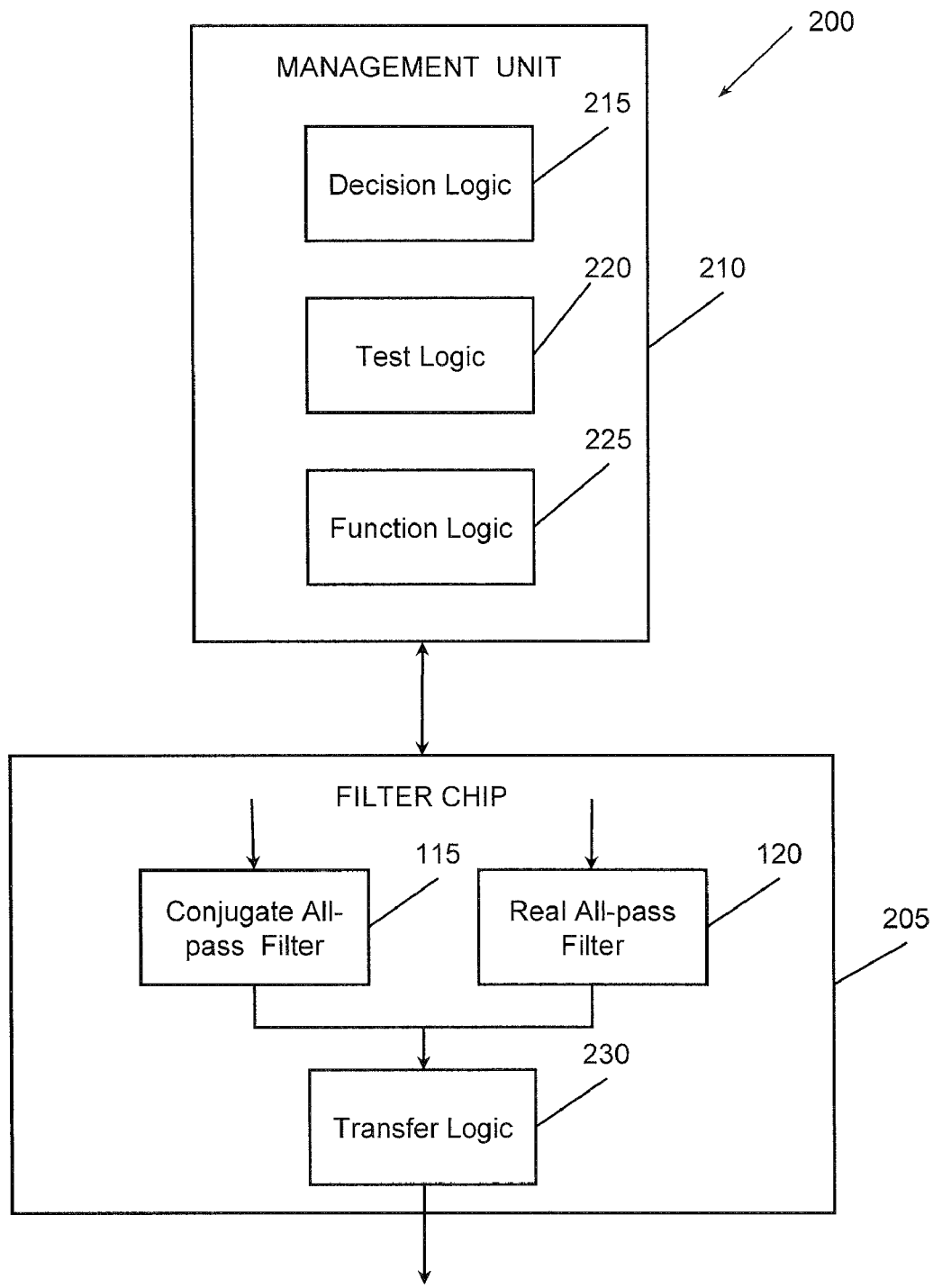
FIG. 2 illustrates one embodiment of an apparatus that manages digital signal filters.

FIG. 2 illustrates one embodiment of an apparatus 200 that manages digital signal filters. The apparatus 200 includes a filter chip 205 implemented with the conjugate all-pass filter 115 and the real all-pass filter 120 of FIG. 1. The filter chip 205 can include additional filters. The filters 115, 120 are designed with filter coefficients. To control selection and implementation of the filter coefficients, the apparatus 200 includes a management unit 210. For example, the management unit 210 is configured with decision logic 215 that selects coefficients, test logic 220 that tests various combinations of coefficients, and function logic 225 that configures the filters 115, 120 with the selected coefficients. The filter coefficients are used to modify and/or adjust the phase and/or magnitude of signals passing through the filters 115, 120.

In one embodiment, the decision logic 215 selects a conjugate coefficient for the conjugate all-pass filter 115 and a real coefficient for the real all-pass filter 120. The decision logic 215 makes the selections based, at least in part, on predicted filter phase outputs caused by implementation of the conjugate coefficient and the real coefficient. For example, the filter coefficients are selected to optimize at least two predetermined conditions. A first condition is that the filter output signals have magnitudes equal to the magnitudes of the respective filter input signals. Thus the magnitudes of the input signals are preserved through the filtering operations. A second condition is that the filter output signals have no phase difference between each other. Under some operating conditions it may be difficult to fully satisfy both conditions simultaneously. Thus in some embodiments, the coefficients are selected so one condition is satisfied completely and the other condition is approximately satisfied. In one example, the coefficients are selected so that the magnitudes of the output signals are equal to the magnitudes of the respective input signals while the output signals have a minimal phase difference between each other. In another example, the output signals have near equal magnitudes with no phase difference.

In another embodiment of coefficient selection, suppose the analog-to-digital converter 105 (shown in FIG. 1) is configured to sample the signal 102 at a rate above the Nyquist rate (e.g., two times the bandwidth of a bandlimited signal or a bandlimited channel). The Nyquist rate is based on the Nyquist sampling theorem. After sampling, the frequency of the output signal is limited and does not extend beyond a certain maximum frequency $\omega\_max$ (where $\omega\_max<\pi$). Thus, the coefficients can be selected to obtain filter responses that satisfy the two predetermined conditions for frequencies up to $\omega\_max$.

In some embodiments, the filters 115, 120 are subject to coefficient ranges of allowable coefficient values. The test logic 220 tests various combinations of coefficient values within the coefficient ranges to produce test results relative to the predetermined conditions. The decision logic 215 selects the conjugate coefficient and real coefficient based, at least in part, on the test results. After selection, the function logic 225 causes the filters 115, 120 to be configured with the selected conjugate coefficient and selected real coefficient, respectively. When signals are filtered by the filters 115, 120, the coefficients cause the filter output signals to have magnitudes equal or nearly equal to their respective input signal magnitudes, and have equal or near equal phases that are more closely aligned. In one embodiment, the filters 115, 120 are first order filters and real-valued coefficients are implemented.

In another embodiment, the filter chip 205 includes transfer logic 230. The transfer logic 230 transmits the filtered digital signal outputs from the filters 115, 120 to a processor or other components.

Figure 3:
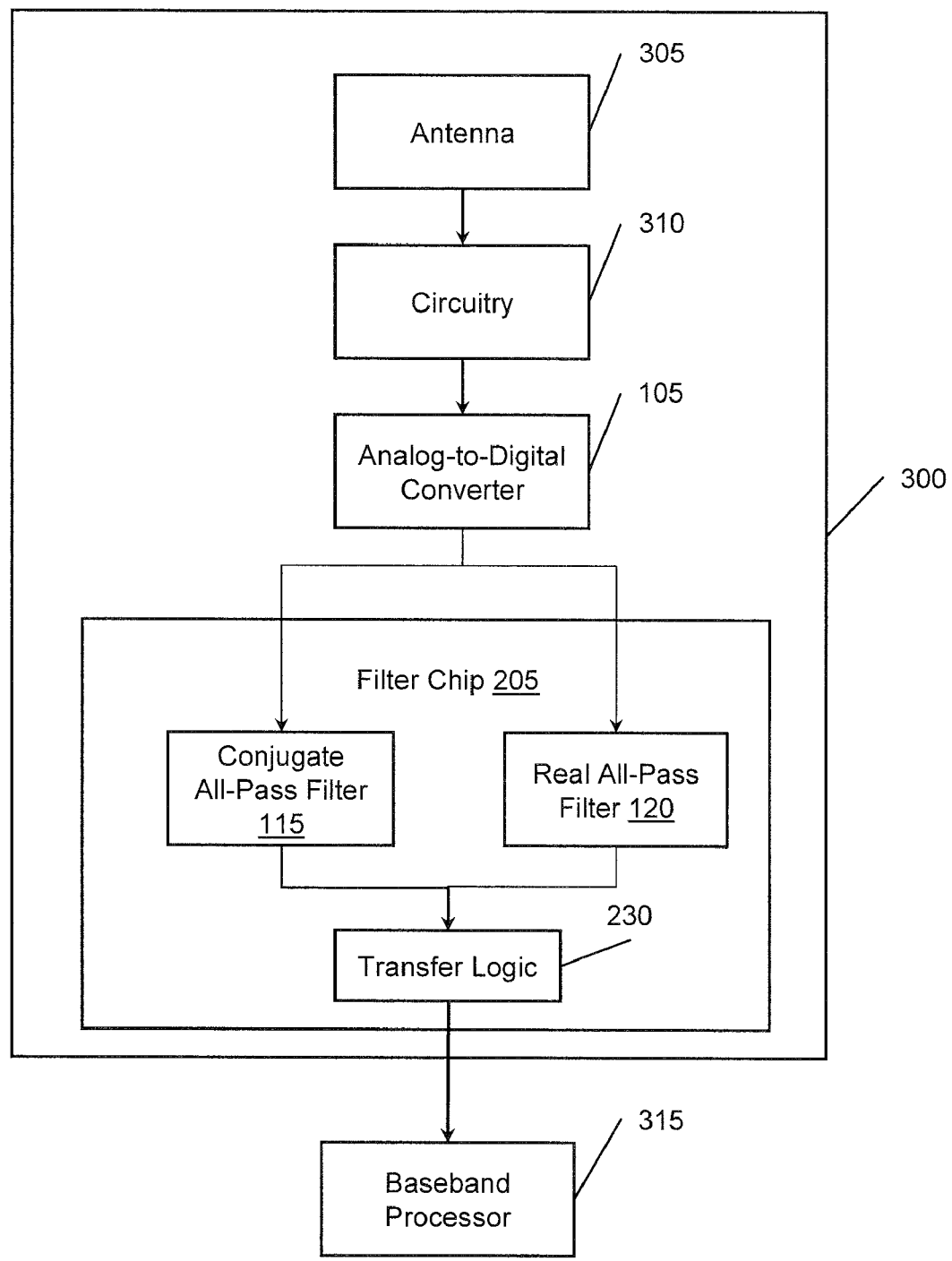
FIG. 3 illustrates one embodiment of an apparatus that processes a communication signal.

FIG. 3 illustrates one embodiment of an apparatus 300 implemented with the analog-to-digital converter (ADC) 105 of FIG. 1 and the filter chip 205 of FIG. 2. For example, the apparatus 300 can be an electronic device that processes communication signals. The apparatus 300 includes an antenna 305 to collect wireless signals in analog form. Circuitry 310 separates the analog signals into a real component and a conjugate (imaginary) component. The ADC 105 can then sample the real component and imaginary component separately (e.g. alternately samples the components), and at different times. For example, if the ADC 105 is a ping-pong ADC, then the ADC 105 switches between sampling the real component and the conjugate component. The sampling enables the ADC 105 to convert the analog real component and analog conjugate component into corresponding digital values/signals.

In one embodiment, the apparatus 300 is an 802.11a/g/n compliant system and the ADC 105 samples the analog signal at a rate above the Nyquist rate. Sampling at the rate above the Nyquist rate provides a maximum frequency threshold for the outputs. The apparatus 300 can be implemented to be compliant with other wireless protocols.

The real digital component and conjugate digital component outputted by the ADC 105 are filtered by the filter chip 205 as described above. The apparatus 300 communicates the filtered signals through the transfer logic 230 to a baseband processor 315 for further processing.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional, not illustrated blocks.

Figure 4:
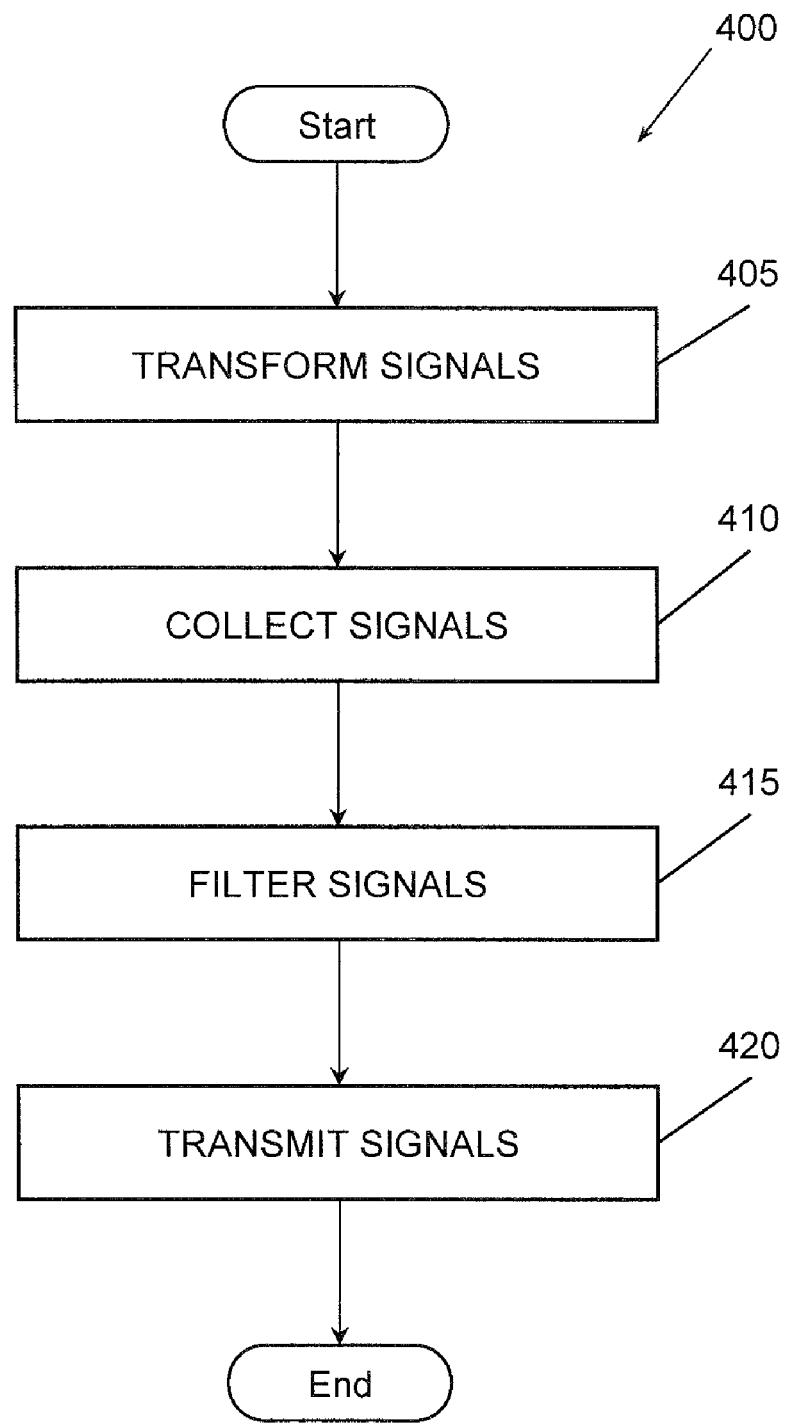
FIG. 4 illustrates one embodiment of a method for modifying a complex signal.

FIG. 4 illustrates one embodiment of a method 400 for processing and filtering a complex signal (e.g., an analog signal). For example, the method 400 may be implemented with the apparatus of FIG. 1. Method 400 may initiate when analog signals are received by an electronic device (e.g., via an antenna) and are processed for conversion into digital form.

At 405, the analog signal is transformed into two distinct signal components: a conjugate analog component and a real analog component. The conjugate analog component and the real analog component are then sampled individually and converted into a conjugate digital component and real digital component. In one embodiment, the conversion is performed by an analog-to-digital converter (e.g., ADC 105 shown in FIG. 1).

At 410, the conjugate digital component and real digital component are collected, for example, by a filter (e.g. inputted to the filter). In one embodiment, the filter may be the apparatus 100 shown in FIG. 1 or the filter chip 205 shown in FIG. 2. At 415, the conjugate digital component and real digital component are filtered with separate digital all-pass filters. The filtering may include the use of selected filter coefficients as described previously to cause phases of the conjugate digital component and real digital component to align and/or to preserve the magnitudes of the respective signals. At 420, the filtered conjugate digital component and the filtered real digital component are transmitted to a processor or other device.

Figure 5:
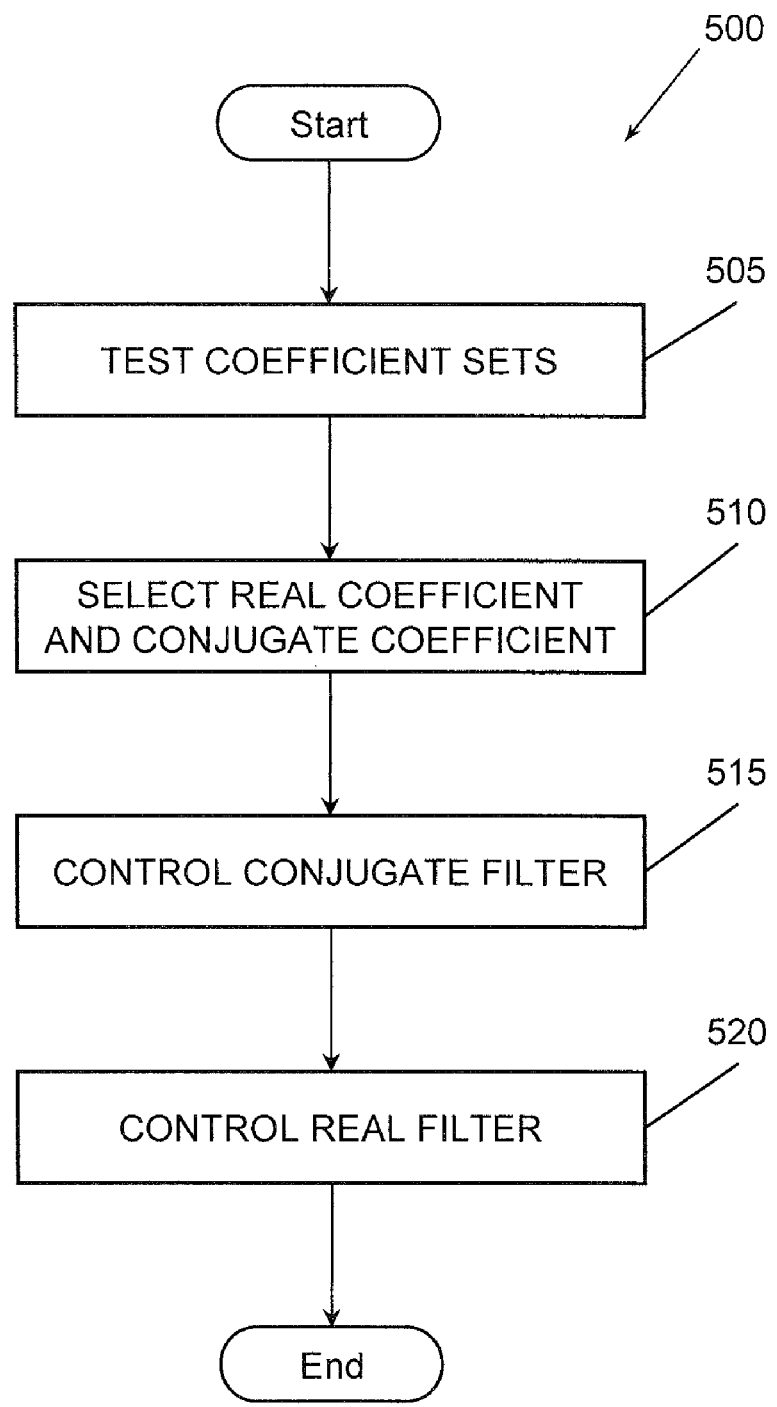
FIG. 5 illustrates one embodiment of a method for configuring filters.

FIG. 5 illustrates one embodiment of a method 500 for configuring filters used in filtering digital signal components. In one example, method 500 may be implemented by the apparatus 200 shown in FIG. 2 that operates with filter chip 205 implemented with the conjugate all-pass filter 115 and the real all-pass filter 120. As previously discussed, a phase difference between filter outputs is directly related to coefficients of the filters. Consider an example when the filter chip 205 is manufactured and the filters 115 and 120 are produced with fixed coefficients. A device (e.g., management unit 210) may select the coefficients in order to minimize a phase difference between filter outputs. In other embodiments, the coefficients are selected to minimize the phase difference while preserving the magnitudes of the signals (e.g. signal magnitude before filtering equals or nearly equals signal magnitude after filtering).

At 505, different digital filter coefficient sets are tested to produce a result. In one embodiment, a computer simulation program can perform the testing. Filters can have allowable filter ranges and the computer simulation program randomly selects a real coefficient and a conjugate coefficient within the filter ranges. The program runs a test to determine an expected phase difference between the filters when the filters are implemented with the selected coefficients. The computer simulation program makes a number of selections and test runs (e.g., 100 tests or other selected amount). After running the tests, a coefficient set with an optimal result is selected. Thus, at 510, coefficients are selected for the digital conjugate filter 115 and the digital real filter 120.

In one embodiment, a user provides an allowable phase difference to the simulation program. When the simulation program discovers a coefficient set that meets the allowable phase difference, then the program stops further testing. In one embodiment, coefficients are selected to improve an image suppression ratio for an outputted complex digital signal.

An implementation apparatus programs the coefficients on the filters 115 and 120. At 515, the implementation apparatus controls the digital conjugate filter 115 to implement the selected conjugate coefficient. At 520, the digital real filter 120 is controlled to implement the selected real coefficient. In one embodiment, implementation of the coefficients includes programming the filters on the filter chip with the selected coefficients.

To the extent that the term "includes" or "including" is employed in the detailed description or the claims, it is intended to be inclusive in a manner similar to the term "comprising" as that term is interpreted when employed as a transitional word in a claim.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. For example, the techniques described above can be used to align signals separately generated by one or more analog-to-digital converters. Therefore, the invention is not limited to the specific details, the representative apparatus, and illustrative examples shown and described. Thus, this application is intended to embrace alterations, modifications, and variations that fall within the scope of the appended claims.

What is claimed is:

1. An apparatus, comprising:
   an analog-to-digital converter configured to:
   receive an analog signal, the analog signal having a first analog component and a second analog component, and
   alternately sample the first analog component and the second analog component to respectively generate a first digital component and a second digital component, the second digital component having a phase that is mismatched with respect to a phase of the first digital component due to the analog-to-digital converter alternately sampling the first analog component and the second analog component; and
   a filter configured to:
   filter each of the first digital component and the second digital component, and
   substantially align the phase of the first digital component and the phase of the second digital component.

2. The apparatus of claim 1, where the filter includes:
   a first filter configured to filter the first digital component; and a second filter configured to filter the second digital component.

3. The apparatus of claim 1, where the filter is configured to:
filter the first digital component to produce a first output that has a magnitude equal to a magnitude of the first digital component; and
filter the second digital component to produce a second output that has a magnitude equal to a magnitude of the second digital component.

4. The apparatus of claim 1, where the first digital component is a conjugate digital component and the second digital component is a real digital component and where the filter includes:
a conjugate all-pass filter to filter the conjugate digital component; and
a real all-pass filter to filter the real digital component.

5. The apparatus of claim 4, further including a decision logic to select a conjugate coefficient associated with the conjugate all-pass filter and a real coefficient associated with the real all-pass filter, where the conjugate coefficient and the real coefficient are selected as a function of an anticipated phase difference between a conjugate output from the conjugate all-pass filter and a real output from the real all-pass filter.

6. The apparatus of claim 1, further comprising:
transfer logic to transmit output from the filter to a processor.

7. The apparatus of claim 1, where the filter comprises a plurality of first order all-pass filters.

8. The apparatus of claim 1, where the analog-to-digital converter comprises means for converting an analog signal into a digital signal,
where the conjugate all-pass filter comprises means for filtering the conjugate component, and
where the real all-pass filter comprises means for filtering the real component.

9. A method, comprising:
receiving an analog signal, the analog signal having a first analog component and a second analog component;
alternately sampling the first analog component and the second analog component to respectively generate a first digital component and a second digital component, the second digital component having a phase that is mismatched with respect to a phase of the first digital component due to the alternate sampling of the first analog component and the second analog component; and
filtering the first digital component and the second digital component to substantially align the phase of the first digital component and the phase of the second digital component.

10. The method of claim 9, where the alternately sampling includes transforming the analog signal into the first digital component being a conjugate digital signal component and the second digital component being a real digital signal component.

11. The method of claim 9, further comprising:
transmitting the filtered first digital component and the filtered second digital signal component to a processor.

12. The method of claim 9, where the first digital component is a conjugate digital component and the second digital component is a real digital component; and
where the filtering includes filtering the conjugate digital component with a conjugate all-pass filter and filtering the real digital component with a real all-pass filter.

13. The method of claim 9, comprising:
testing digital filter coefficient sets to produce a result based, at least in part, on predetermined conditions; and
selecting a real coefficient for a digital real filter and a conjugate coefficient for a digital conjugate filter based, at least in part, on the result, where the filtering is performed by the digital real filter and the digital conjugate filter.

14. The method of claim 13, comprising:
controlling the digital conjugate filter to implement with the conjugate coefficient; and
controlling the digital real filter to implement with the real coefficient.

15. The method of claim 9 where the filtering preserves magnitudes of the first digital component and the second digital component.

* * * * *